United States Patent
Yu et al.

(10) Patent No.: US 6,559,040 B1
(45) Date of Patent: May 6, 2003

(54) PROCESS FOR POLISHING THE TOP SURFACE OF A POLYSILICON GATE

(75) Inventors: Chen-Hua Yu, Hsin-Chu (TW); Chung-Long Chang, Dou-Liu (TW); Syun-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/421,517

(22) Filed: Oct. 20, 1999

(51) Int. Cl.⁷ .................... H01L 21/302; H01L 21/3205
(52) U.S. Cl. ........................ 438/585; 438/692
(58) Field of Search ................ 438/585, 592, 438/633, 692, 693, 697, 699

(56) References Cited

U.S. PATENT DOCUMENTS

| 5,214,001 A | * | 5/1993 | Ipposhi et al. ............... 438/479 |
| 5,434,093 A | | 7/1995 | Chau et al. ..................... 437/41 |
| 5,500,077 A | * | 3/1996 | Nishibayashi et al. ........ 216/38 |
| 5,502,008 A | * | 3/1996 | Hayakawa et al. .......... 438/675 |
| 5,688,700 A | | 11/1997 | Kao et al. ..................... 437/29 |
| 5,723,381 A | | 3/1998 | Grewal et al. ............... 438/633 |
| 5,804,514 A | * | 9/1998 | Kwon .......................... 438/697 |
| 5,911,111 A | * | 6/1999 | Bohr et al. ................... 438/585 |
| 6,114,251 A | * | 9/2000 | Nguyen et al. .............. 438/710 |
| 6,191,003 B1 | * | 2/2001 | Lin et al. ..................... 438/431 |

FOREIGN PATENT DOCUMENTS

| JP | 410012547 A1 | * | 1/1998 | ........... H01L/21/20 |
| JP | 11251599 A1 | * | 9/1999 | ......... H01L/21/336 |
| JP | 2000022159 A1 | * | 1/2000 | ......... H01L/21/336 |
| JP | 2000124457 A1 | * | 4/2000 | ......... H01L/21/336 |
| WO | WO-96/27206 A1 | * | 9/1996 | |

* cited by examiner

Primary Examiner—Amir Zarabian
Assistant Examiner—Toniae M. Thomas
(74) Attorney, Agent, or Firm—George O. Saile; Stephen B. Ackerman

(57) ABSTRACT

The process of polishing the top surface of a polysilicon gate electrode often results in significant loss of material before adequate smoothness is achieved. This problem is overcome in the present invention by laying down a thin layer of a dielectric on the surface of the polysilicon prior to the application of CMP. This provides a sacrificial layer that facilitates the polishing operation and results in a polysilicon surface that is both very smooth and achievable with minimum loss of polysilicon.

13 Claims, 2 Drawing Sheets

US 6,559,040 B1

PROCESS FOR POLISHING THE TOP SURFACE OF A POLYSILICON GATE

FIELD OF THE INVENTION

The invention relates to the general field of semiconductor device manufacturing with particular reference to fabrication of the gate pedestal in a field effect transistor.

BACKGROUND OF THE INVENTION

The process for manufacturing a field effect transistor includes the steps of laying down a layer of polysilicon over a layer of gate oxide. The polysilicon is then patterned and etched down to the level of the oxide in order to form the gate pedestal. A preferred method for depositing this polysilicon has been the silicon furnace.

Although the silicon furnace is preferred for depositing the polysilicon because of its large saturation current, the surface of the polysilicon that is obtained in this manner is relatively rough. Typical roughness numbers are about 4.5 nm (RMS), associated with a maximum peak-to-valley surface topography of about 24 nm. As the dimensions of semiconductor devices grew smaller and smaller, this degree of roughness could not be tolerated so it has become common practice to smooth out the polysilicon upper surface before proceeding to form the gate pedestal. This is most conveniently done by means of CMP (chemical mechanical polishing).

A problem associated with CMP is a tendency to remove more polysilicon than is necessary because of the difficulty of determining exactly when the polysilicon surface has achieved its maximum level of smoothness. This adds to the cost of the manufacturing process and in some circumstances may even lead to the removal of more polysilicon than was intended. The present invention teaches how no more polysilicon than is absolutely necessary needs to be removed.

A routine search did not uncover any prior art that solves this problem in the manner of the present invention. Several references of interest were, however, encountered. For example, Grewal et al. (U.S. Pat. No. 5,723,381) use a polysilicon layer in sacrificial mode in order to form self-aligned, overlapping bit line contacts. Chau et al. (U.S. Pat. No. 5,434,093) teach the use of CMP to planarize the surface of an oxide filled trench while Kao et al. (U.S. Pat. No. 5,688,700) teach the use of CMP for planarizing gate material but they did not use a sacrificial dielectric layer.

SUMMARY OF THE INVENTION

It has been an object of the present invention to provide a process for smoothing the upper surface of a deposited layer of polysilicon.

Another object of the invention has been to minimize the amount of polysilicon that is lost during the smoothing operation.

These objects have been achieved by laying down a thin layer of a dielectric on the surface of polysilicon prior to the application of CMP. This layer serves as a sacrificial layer to facilitate the polishing operation and results in a polysilicon surface that is both very smooth and that has undergone minimum loss of polysilicon.

DESCRIPTION OF THE PREFERRED EMBODIMENTS

Figure 1:
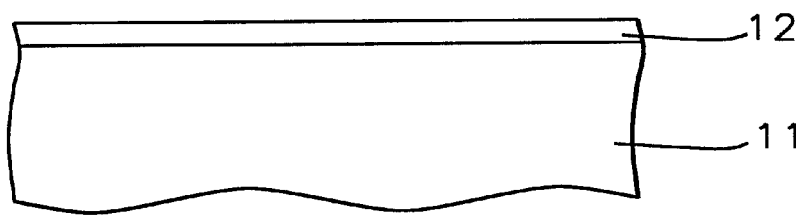
FIG. 1 shows the starting point for the process of the present invention which is a silicon layer with a thin layer of gate oxide on its surface.

We begin a description of the process of the present invention by referring to FIG. 1. Silicon body 11 (normally a silicon wafer on which an integrated circuit has been, or will be, formed) is oxidized at its surface to form layer of gate oxide 12, between about 20 and 75 Angstroms thick.

Figure 2:
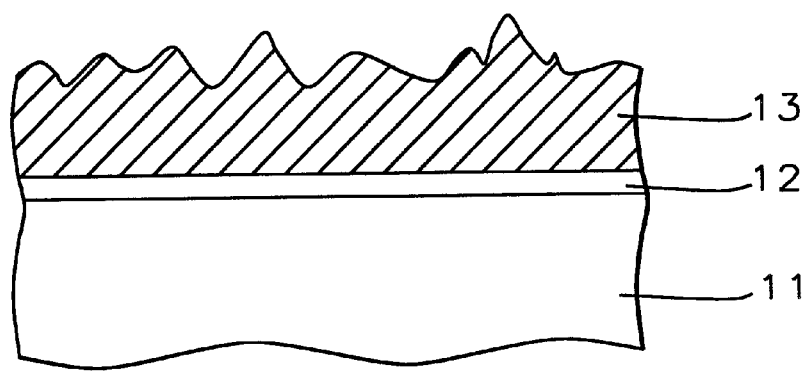
FIG. 2 shows the structure after the deposition of a layer of polysilicon.
Figure 3:
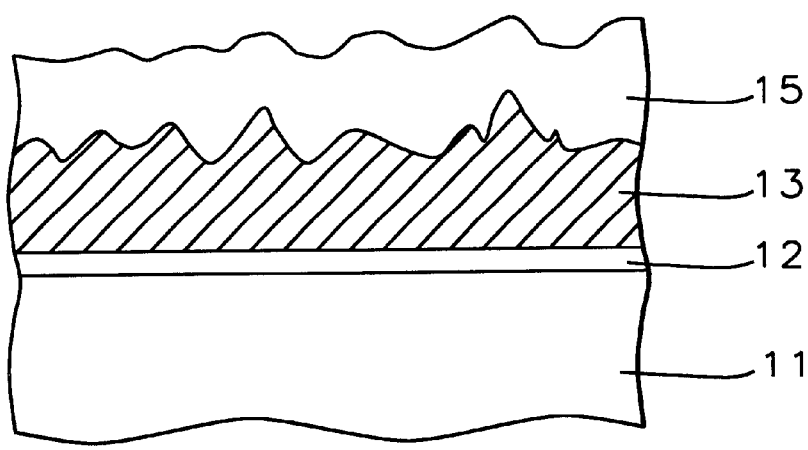
FIG. 3 shows structure after the deposition of a thin layer of sacrificial oxide.

Then, as shown in FIG. 2, polysilicon layer 13 is deposited over the oxide layer to a thickness between about 0.16 and 0.22 microns. The chosen deposition method was a silicon furnace which is which is supplied by KE or TEL and designed to operate at 15 Pa and 620° C. for a silane flow rate of about 400 SCCM. The thickness of the polysilicon layer was between about 0.16 and 0.22 microns.

Figure 4:
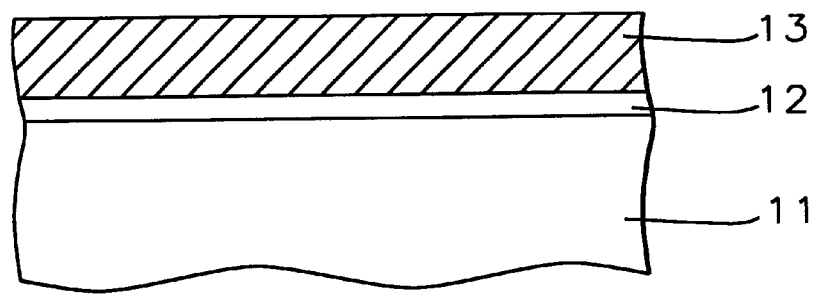
FIG. 4 shows the final appearance of the polysilicon after the application of CMP.

Next, as a key feature of the invention, a sacrificial layer 15 of a dielectric material such as silicon oxide, silicon oxynitride, SACVD (sub-atmospheric chemical vapor deposition) TEOS (tetra ethyl orthosilicate), HDP (high density plasma) PSG (phospho-silicate glass), or HDP USG (undoped silicate glass) was laid down over polysilicon layer 13, as illustrated in FIG. 4. Although any of the above listed dielectric materials would work, and although they could be deposited by any of several techniques such as LPCVD (low pressure CVD), PECVD (plasma enhanced CVD), CVD, or PVD (physical vapor deposition), our preferred process has been CVD based on the ozone enhanced TEOS process.

With the sacrificial layer 15 in place, the wafer was polished by means of CMP for between about 10 and 30 seconds until all of the sacrificial layer had been removed (as illustrated in FIG. 4). The point at which this occurred was easy to determine because the low removal rate made time mode control possible. Only a small increase in the CMP time was needed (it would have taken about 5 seconds if the polysilicon had been polished directly, as in the prior art) because the thickness of the sacrificial layer (between about 150 and 500 Angstroms) could be kept to a minimum, being chosen on the basis of the surface roughness of the polysilicon in its as-deposited condition which was typically between about 40 and 50 Angstroms RMS, corresponding to a maximum peak-to-valley surface topography of between about 250 and 450 Angstroms.

Thus, with the removal of only between about 200 and 400 microns of polysilicon from the surface of the wafer, a final smoothness level for the polished surface between about 2 and 3 Angstroms RMS, corresponding to a maximum peak-to-valley surface topography of between about 10 and 20 Angstroms, could be obtained.

The process was then concluded by masking the polished polysilicon with photoresist using standard photolithographic techniques, and then etching the polysilicon down to the level of the gate oxide, thereby forming the gate pedestal.

The effectiveness of the present invention is illustrated by the data summarized in TABLE I below which compares surface roughness (characterized by both RMS values as well as Max-Min (peak-valley) values) with and without the introduction of the sacrificial layer of dielectric. Comparison data is also provided for a layer of amorphous (as opposed to poly) silicon (αSi) since this is known to have a smoother surface (than polysilicon) in its as-deposited condition.

TABLE I

|  | Poly as-dep. | α Si as-dep. | Direct CMP (hard pad) | Direct CMP (soft pad) | O₃ TEOS 150Å cap |
| --- | --- | --- | --- | --- | --- |
| CMP time | — | — | 6 sec. | 5 sec. | 20 sec. soft pad |
| RMS (nm) | 4.555 | 0.453 | 0.255 | 0.388 | 0.221 |
| Max–Min (nm) | 23.925 | 2.448 | 1.734 | 2.038 | 1.5 |
| poly thickness | 2035Å ± 0.45% | — | 1706Å ± 0.03% | 1820Å ± 1.92% | 1922Å ± 0.89% |
| poly loss Å | — | — | 317 | 202 | 112 |

The data summarized in TABLE I confirm that application of the process of the present invention results in a polysilicon layer that is smoother than the best obtainable through the prior art and significantly reduces the amount of polysilicon that is lost as a result of the polishing operation.

As indicated above, our preferred material for the sacrificial layer taught by the present invention has been ozone TEOS (although several other materials would still work). In TABLE II we present data that compares the effectiveness of ozone TEOS to plasma enhanced silicon oxynitride and plasma enhanced silicon oxide. As can be seen, the O₃ TEOS has a slightly better end result. Additionally, O₃ TEOS was preferred because it has better gap filling characteristics than PE oxide or PE silicon oxynitride and because it results in improved intra wafer uniformity after CMP.

TABLE II

|  |  | CMP 5 sec. | CMP 10 sec. | CMP 15 sec. | CMP 20 sec. |
| --- | --- | --- | --- | --- | --- |
| PEOX | RMS/Max–Min | 2.71/10.40 nm | 2.45/8.80 nm | 0.65/5.37 nm | 0.27/3.47 nm |
|  | Poly remain | 2023Å ± 0.36% | 2023Å ± 0.69% | 1985Å ± 1.02% | 1716Å ± 2.34% |
| PE-SiON | RMS/Max–Min | 0.93/4.00 nm | 0.52/2.83 nm | 0.23/1.51 nm | 0.23/1.27 nm |
|  | Poly remain | 2020Å ± 0.87% | 1986Å ± 0.93% | 1924Å ± 1.93% | 1610Å ± 1.89% |
| O₃-TEOS | RMS/Max–Min | — | 1.88/7.92 nm | 0.36/3.12 nm | 0.22/1.50 nm |
|  | Poly remain | — | 2020Å ± 0.76% | 1994Å ± 0.56% | 1922Å ± 0.89% |

While the invention has been particularly shown and described with reference to the preferred embodiments thereof, it will be understood by those skilled in the art that various changes in form and details may be made without departing from the spirit and scope of the invention.

What is claimed is:

1. A process for depositing a layer of polysilicon, comprising:
   providing a silicon body;
   forming a layer of oxide on said silicon body;
   growing a layer of polysilicon, having a top surface, on the oxide layer by means of a silicon furnace;
   depositing a layer of a dielectric on the polysilicon layer, said dielectric being selected from the group consisting of silicon oxide, silicon oxynitride, O₃ TEOS, LP TEOS, SACVD TEOS, HDP PSG, and HDP USG; and
   by means of CMP, polishing the dielectric layer until it is entirely removed together with between 200 and 400 Angstroms of polysilicon, whereby said polysilicon layer acquires an upper surface having a smoothness level between about 2 and 3 Angstroms RMS, corresponding to a maximum peak-to-valley surface topography of between about 10 and 20 Angstroms.

2. The process of claim 1 wherein the layer of polysilicon, immediately after its deposition, has a thickness between about 0.16 and 0.22 microns.

3. The process of claim 1 wherein the dielectric layer has a thickness between about 150 and 500 Angstroms.

4. The process of claim 1 wherein the step of depositing the polysilicon by means of a silicon furnace further comprises using a pressure of about 15 Pa, at a temperature of about 620° C. and a silane flow rate of about 400 SCCM.

5. The process of claim 1 wherein the polysilicon layer has a surface roughness between about 40 and 50 Angstroms RMS before CMP.

6. The process of claim 1 wherein CMP is used for a between about 10 and 30 seconds.

7. A process for forming a gate pedestal for a field effect transistor comprising:
   providing a silicon wafer;
   forming a layer of gate oxide on said wafer;
   growing a layer of polysilicon, having a top surface, on the oxide layer by means of a silicon furnace;
   depositing a sacrificial layer of silicon oxide on the polysilicon layer by means of an ozone TEOS process;
   by means of CMP, polishing the sacrificial layer until it has been entirely removed together with between 200 and 400 Angstroms of polysilicon, whereby said polysilicon layer acquires an upper surface having a smoothness level between about 2 and 3 Angstroms RMS, corresponding to a maximum peak-to-valley surface topography of between about 10 and 20 Angstroms; and
   patterning and etching the polysilicon layer down to the level of the gate oxide, thereby forming a gate pedestal.

8. The process of claim 7 wherein the layer of polysilicon, immediately after its deposition, has a thickness between about 0.16 and 0.22 microns.

9. The process of claim 7 wherein the sacrificial layer has a thickness between about 150 and 500 Angstroms.

10. The process of claim 7 wherein the step of depositing the polysilicon by means of a silicon furnace further comprises using a pressure of about 15 Pa, at a temperature of about 620° C. and a silane flow rate of about 400 SCCM.

11. The process of claim 7 wherein the polysilicon layer has a surface roughness between about 40 and 50 Angstroms RMS before CMP.

12. The process of claim 7 wherein CMP is used for a between about 10 and 30 seconds.

13. A process for depositing a layer of polysilicon, comprising:

provding a silicon body;

forming a layer of oxide on said silicon body;

growing a layer of polysilicon, having a top surface, on the oxide layer by means of a silicon furnace;

depositing a layer of TEOS on the polysilicon layer using a deposition method selected from the group consisting of CVD with ozone present, plasma enhanced CVD, LPCVD, and HDPCVD; and by means of CMP, polishing the dielectric layer until it is entirely removed together with between 200 and 400 Angstroms of polysilicon, whereby said polysilicon layer acquires an upper surface having a smoothness level between about 2 and 3 Angstroms RMS, corresponding to a maximum peak-to-valley surface topography of between about 10 and 20 Angstroms.

\* \* \* \* \*